United States Patent
Feng et al.

(10) Patent No.: US 10,256,260 B2
(45) Date of Patent: Apr. 9, 2019

(54) DISPLAY SUBSTRATE, MANUFACTURING METHOD THEREFOR AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Bo Feng, Beijing (CN); Qing Miao, Beijing (CN); Yu Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 47 days.

(21) Appl. No.: 15/514,328

(22) PCT Filed: Feb. 19, 2016

(86) PCT No.: PCT/CN2016/074125
§ 371 (c)(1),
(2) Date: Mar. 24, 2017

(87) PCT Pub. No.: WO2016/155429
PCT Pub. Date: Oct. 6, 2016

(65) Prior Publication Data
US 2017/0287948 A1    Oct. 5, 2017

(30) Foreign Application Priority Data
Mar. 27, 2015  (CN) .......................... 2015 1 0141487

(51) Int. Cl.
H01L 27/12 (2006.01)
G02F 1/1345 (2006.01)
(Continued)

(52) U.S. Cl.
CPC ........ H01L 27/1244 (2013.01); G02F 1/1368 (2013.01); G02F 1/13458 (2013.01);
(Continued)

(58) Field of Classification Search
CPC ..................... H01L 27/1244; H01L 27/1262
See application file for complete search history.

(56) References Cited

U.S. PATENT DOCUMENTS 6,255,130 B1 *  7/2001  Kim ................. G02F 1/136227
                                              438/30
6,744,486 B2 *  6/2004  Kim ..................... G02F 1/13458
                                              349/187
(Continued)

FOREIGN PATENT DOCUMENTS

CN     1254948 A     5/2000
CN     1560901 A     1/2005
(Continued)

OTHER PUBLICATIONS

International Search Report and Written Opinion dated May 24, 2016; PCT/CN2016/074125.
(Continued)

*Primary Examiner* — Asok K Sarkar
*Assistant Examiner* — Grant S Withers
(74) *Attorney, Agent, or Firm* — Ladas & Parry LLP

(57) ABSTRACT

Provided is a display substrate. The display substrate includes a base substrate and a thin film transistor which is formed on the base substrate, wherein the thin film transistor includes a drain electrode, and at least one pad structure is arranged on an outer side of the drain electrode; a vertical distance between a top surface of the pad structure and the base substrate is less than the vertical distance between the top surface of the drain electrode and the base substrate, and is greater than the vertical distance between the top surface (Continued)

of the substrate, which is located on one side of the pad structure is far away from the drain electrode, and the base substrate. Further provided are a manufacturing method for the display substrate and a display device.

20 Claims, 3 Drawing Sheets

(51) Int. Cl.
    *G02F 1/1368*     (2006.01)
    *G02F 1/1362*     (2006.01)
    *H01L 29/417*     (2006.01)

(52) U.S. Cl.
    CPC .... *G02F 1/136227* (2013.01); *H01L 27/1262* (2013.01); *H01L 29/41733* (2013.01); *G02F 2201/123* (2013.01)

(56) References Cited

U.S. PATENT DOCUMENTS

| | | | |
|---|---|---|---|
| 9,954,006 B2 * | 4/2018 | Lee | H01L 27/1225 |
| 2004/0218133 A1 * | 11/2004 | Park | G02F 1/133305 |
| | | | 349/153 |
| 2010/0084652 A1 * | 4/2010 | Yamazaki | H01L 27/1225 |
| | | | 257/43 |
| 2011/0284853 A1 * | 11/2011 | Park | H01L 27/1244 |
| | | | 257/59 |
| 2013/0285044 A1 * | 10/2013 | Yuan | H01L 29/4908 |
| | | | 257/43 |
| 2014/0353661 A1 * | 12/2014 | Seo | H01L 27/3279 |
| | | | 257/43 |
| 2015/0002788 A1 * | 1/2015 | Guo | G02F 1/133603 |
| | | | 349/69 |
| 2015/0155303 A1 * | 6/2015 | Kim | H01L 27/1288 |
| | | | 257/59 |
| 2017/0229487 A1 * | 8/2017 | Ko | H01L 27/1225 |

FOREIGN PATENT DOCUMENTS

| | | |
|---|---|---|
| CN | 1020080048861 A | 6/2008 |
| CN | 101567391 A | 10/2009 |
| CN | 101963729 A | 2/2011 |
| CN | 102109691 A | 6/2011 |
| CN | 104716145 A | 6/2015 |

OTHER PUBLICATIONS

First Chinese Office Action dated Mar. 1, 2017; Appln. No. 201510141487.X.

* cited by examiner

DISPLAY SUBSTRATE, MANUFACTURING METHOD THEREFOR AND DISPLAY DEVICE

TECHNICAL FIELD

Embodiments of the disclosure relate to a field of display technology, especially relate to a display substrate, a method for manufacturing the same and a display device.

BACKGROUND

The liquid crystal display device comprises an array substrate. As illustrated in FIG. 1, each pixel in the array substrate comprises a thin film transistor 2' and a plate-like pixel electrode 3' sequentially disposed on a base substrate 1'; the thin film transistor 2' comprises a gate 21', a gate insulation layer 22', an active layer 23', and a source 24' and a drain 25' located in the same layer, herein the gate insulation layer 22' extends to the region where the pixel electrode 3' is located; the pixel electrode 3' is formed on the gate insulation layer 22', and extends from the gate insulation layer 22' to the top surface of the drain 25', so as to overlap the drain 25'.

In the process of manufacturing the array substrate, in order to reduce the number of masks, the array substrate is usually exposed by using a gray-scale mask. The drain 25' and the drain region of the active layer 23' corresponds to the completely-light-blocked region of the gray-scale mask, so that the outer edge of the drain 25' is aligned with the edge of the active layer 23'. At the outer edge of the drain 25', the step difference between the drain 25' and the gate insulation layer 22' is equal to the sum of the thickness of the drain 25' and the thickness of the active layer 23'. Commonly, the thickness of the drain 25' is 0.4 µm, the thickness of the active layer 23' is 0.25 µm, therefore, the step difference is 0.65 µm, which is relatively larger with respect to the thickness of 0.05 µm of the pixel electrode 3', resulting in that the pixel electrode 3' is cracked when it is climbed from the gate insulation layer 22' to the top surface of the drain 25', thus the display effect of the display device is affected.

SUMMARY

In first aspect of the disclosure, it is provided a display substrate, which comprises: a base substrate and a thin film transistor formed on the base substrate; the thin film transistor comprises a drain; wherein at least one pad structure is disposed on an outer side of the drain; a vertical distance between a top surface of the at least one pad structure and the base substrate is less than a vertical distance between a top surface of the drain and the base substrate and greater than a vertical distance between the base substrate and a top surface of the substrate which is located on a side of the at least one pad structure away from the drain In second aspect of the disclosure, it is further provided a display device, which comprises the afore-mentioned display substrate.

In third aspect of the disclosure, it is further provided method for manufacturing a display substrate, the method comprises: forming a thin film transistor and at least one pad structure on a base substrate; wherein, the at least one pad structure is disposed on an outer side of a drain of the thin film transistor; a vertical distance between a top surface of the pad structure and the base substrate is less than a vertical distance between a top surface of the drain and the base substrate and greater than a vertical distance between the base substrate and a top surface of the substrate which is located on a side of the pad structure away from the drain.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 6:
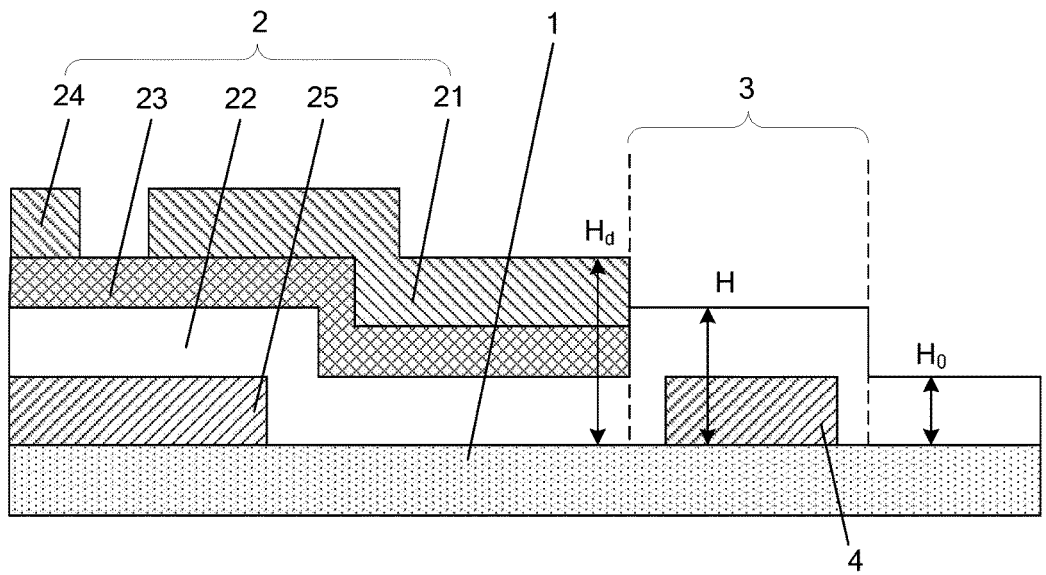
FIG. 6 schematically illustrates a fourth display substrate according to an embodiment of the disclosure.

The present embodiment of the disclosure provides a display substrate, as illustrated in FIG. 6, the display substrate comprises a base substrate 1 and a thin film transistor 2 formed on the base substrate 1, the thin film transistor 2 comprises a drain 21, a pad structure 3 is disposed on an outer side of the drain 21; the vertical distance H between a top surface of the pad structure 3 and the base substrate 1 is less than the vertical distance $H_d$ between a top surface of the drain 21 and the base substrate 1 and is greater than the vertical distance $H_0$ between the base substrate 1 and a top surface of the substrate which is located on a side of the pad structure 3 away from the drain 21. The term "substrate" includes a base substrate and a functional layer disposed on the base substrate, such as a gate insulation layer 22. In contrast, the term "base substrate" does not include the functional layer thereon. As illustrated in FIG. 6, for example, the pad structure 3 is disposed on the base substrate 1.

It is noted that, the display substrate provided in the present embodiment may be an array substrate of a liquid crystal display device, or may be other display substrate comprising a thin film transistor. The drain of the thin film transistor on the display substrate is connected with the pixel electrode, thus the display function is achieved.

In the display substrate provided in the embodiment, since at least one pad structure is disposed on an outer side of the drain, in the subsequent formation of the pixel electrode, the pixel electrode first climbs from the top surface of the substrate which has a minimum vertical distance from the base substrate, to the top surface of the pad structure which has a middle vertical distance from the base substrate, and then climbs to the top surface of the drain which has a maximum vertical distance from the base substrate. As a result, the pixel electrode gradually climbs to the top surface of the drain by undergoing at least two transitions, and the climbing height in each transition is relatively small, so as to avoid the problem that the pixel electrode of the prior art has a large climbing height in only one transition, and also avoid the problem that the pixel electrode is cracked when it is climbed to the top surface of the drain.

Figure 1:
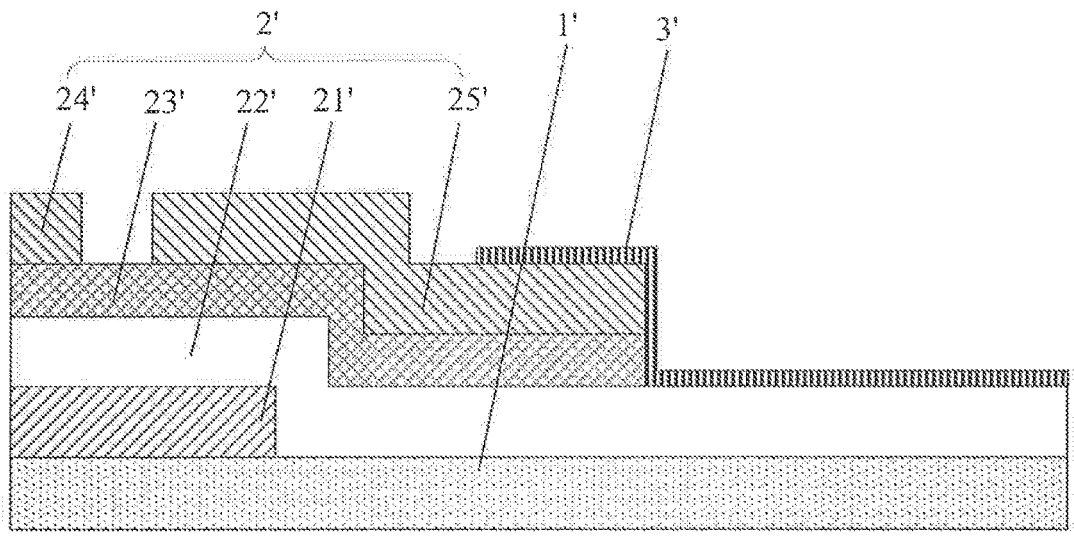
FIG. 1 schematically illustrates a known array substrate.
Figure 2:
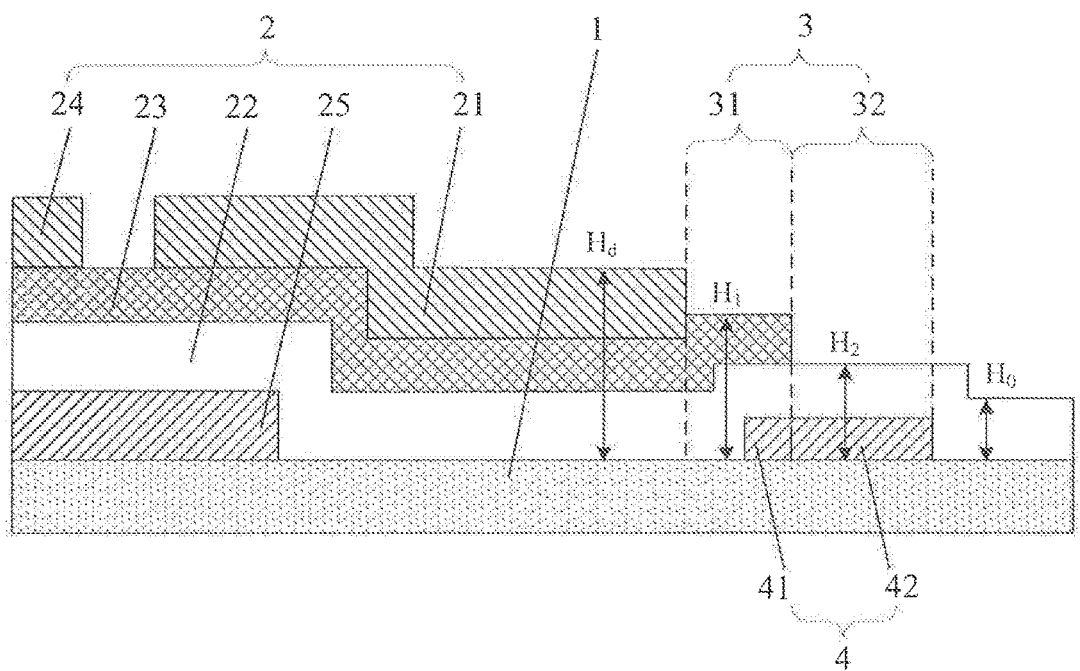
FIG. 2 schematically illustrates a first display substrate according to an embodiment of the disclosure.
Figure 3:
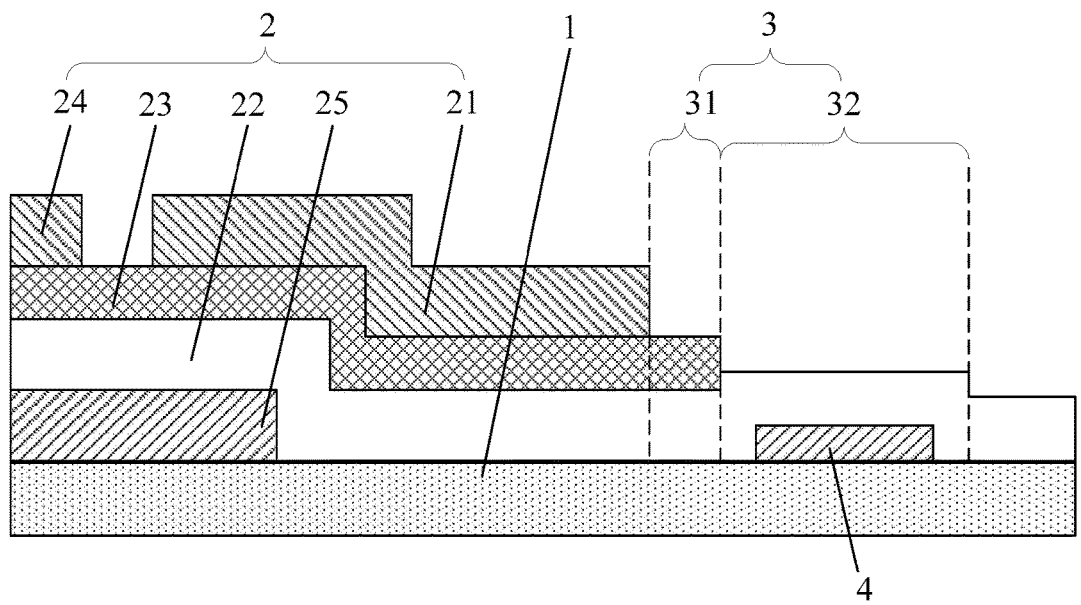
FIG. 3 schematically illustrates a second display substrate according to an embodiment of the disclosure.

In order to further avoid the problem that the pixel electrode is cracked during the climb, the display substrate in an embodiment comprises a plurality of pad structures. In order to be easily understood by those skilled in the art, the display substrate will be described in detail by taking two pad structures 31 and 32 as an example in the present embodiment of the disclosure. As illustrated in FIGS. 2 and 3, in a direction away from the drain 21, the pad structure 3 comprises a first pad structure 31 and a second pad structure 32 in sequence. For example, the vertical distance $H_2$ between the top surface of the second pad structure 32 and the base substrate 1 is less than the vertical distance $H_1$ between the top surface of the first pad structure 31 and the base substrate 1, so that the vertical distance is decreased from the vertical distance $H_d$ between the top surface of the drain 21 and the base substrate 1, the vertical distance $H_1$ between the top surface of the first pad structure 31 and the base substrate 1, the vertical distance $H_2$ between the top surface of the second pad structure 32 and the base substrate 1, to the vertical distance $H_0$ between the top surface of the substrate located on the side away from the drain 21 and the base substrate I, that is, $H_d>H_1>H_2>H_0$, so as to further avoid the problem that the pixel electrode is cracked during the climb.

The two pad structures 31 and 32 are formed of different functional layers formed on the base substrate 1. At least one of the two pad structures comprises a pad 4, so that the two pad structures have different vertical distances between the top surface and the base substrate 1. In order to be easily understood by those skilled in the art, two examples are provided in the following description, the difference between the two examples is that whether the first pad structure 31 comprises the pad 4 or not.

In the example illustrated in FIG. 2, the pad 4 comprises a first pad 41 and a second pad 42 which are connected to each other; the thin film transistor 2 comprises a gate insulation layer 22, an active layer 23, a source 24 and a drain 21 located in the same layer as the source 24, all of which are sequentially formed on the base substrate 1; the first pad structure 31 comprises the first pad 41, the gate insulation layer 22 and the active layer 23 which are located in a region of the first pad structure 31; the second pad structure 32 comprises the second pad 42 and the gate insulation layer 22 which are located in a region of the second pad structure 32.

In another example illustrated in FIG. 3, the thin film transistor 2 comprises a gate insulation layer 22, an active layer 23, a source 24 and a drain 21 located in the same layer as the source 24, all of which are sequentially formed on the base substrate 1; the first pad structure 31 comprises the gate insulation layer 22 and the active layer 23 which are located in a region of the first pad structure 31; the second pad structure 32 comprises the pad 4 and the gate insulation layer 22 which are located in the region of second pad structure 32. In this example, the first pad structure 31 does not comprise the pad 4.

It is noted that, based on the described two pad structures herein, those skilled in the art can obtain other embodiment (s), without any inventive work, which would not be described in detail.

In the above embodiments, the pad 4 is disposed between the gate insulation layer 22 and the base substrate 1. In other embodiments of the disclosure, the pad 4 is disposed over the gate insulation layer 22. As an example, the thin film transistor 2 further comprises a gate 25 located between the gate insulation layer 22 and the base substrate 1, the pad 4 is located in the same layer as the gate 25, and the material of the pad 4 is the same as that of the gate 25, so that the pad 4 and the gate 25 are simultaneously formed by a single patterning process, thus, the manufacturing method for the display substrate can be simplified.

As an example, a thickness of the pad 4 is equal to or less than a thickness of the gate 25. When the thickness of the pad 4 is equal to the thickness of the gate 25, the mask used in the patterning process can be an ordinary mask, without using a gray-scale mask, thus the difficulty of manufacturing the display substrate can be reduced. When the thickness of the pad 4 is less than the thickness of the gate 25, the thickness of the pad 4 is adjustable according to actual requirements, thus the respective vertical distances between the top surface of the drain 21 and the base substrate 1, between the top surface of the first pad structure 31 and the base substrate 1, between the top surface of the second pad structure 32 and the base substrate 1, and between the top surface of the substrate located on the side away from the drain 21 and the base substrate 1, is decreased in turn and the decreased amplitudes are close to or the same as one another, so as to further avoid the problem that the pixel electrode is cracked during the climb.

Figure 4:
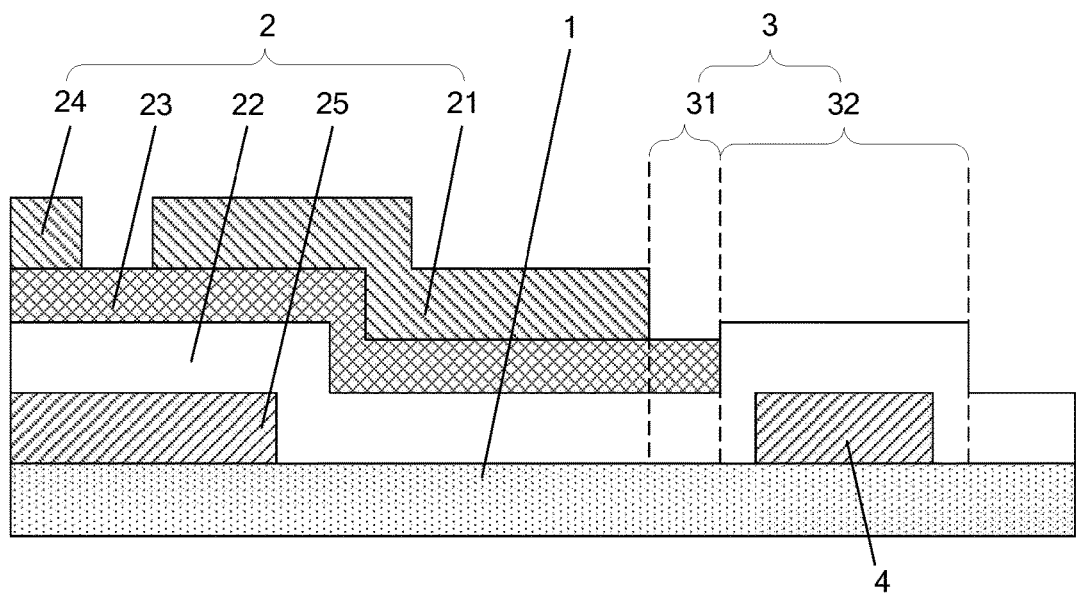
FIG. 4 schematically illustrates a third display substrate according to an embodiment of the disclosure.

As illustrated in FIG. 4, in the case that the first pad structure 31 comprises the gate insulation layer 22 and the active layer 23 located in a region of the first pad structure 31, the thickness of the pad 4 becomes thicker while the thickness of the gate 25 is larger. For example, when the thickness of the gate 25 is 0.4 µm, the thickness of the pad 4 is also 0.4 µm, the thickness of the gate insulation layer 22 is 0.4 µm, and the thickness of the active layer 23 is 0.25 µm, then the vertical distance between the top surface of the second pad structure 32 and the base substrate 1 is 0.8 µm, and the vertical distance between the top surface of the first pad structure 31 and the base substrate 1 is 0.65 µm. Although the vertical distance between the top surface of the second pad structure 32 and the base substrate 1 is greater than the vertical distance between the top surface of the first pad structure 31 and the base substrate 1, since the vertical distance between the top surface of the second pad structure 32 and the base substrate 1 is still less than the vertical distance between the top surface of the drain 21 and the base substrate 1, the problem that the pixel electrode is cracked during the climb can be avoided. As an example, the thickness of the pad 4 is less than the thickness of the active layer 23, so that the vertical distance between the top surface of the second pad structure 32 and the base substrate 1 is less than the vertical distance between the top surface of the first pad structure 31 and the base substrate 1.

An embodiment of the disclosure further provides a display device, which comprises the above display substrate. The display device may be: a liquid crystal panel, an E-paper, a mobile phone, a tablet computer, a television set, a display, a laptop computer, a digital photo frame, a navigator, or any other products or components which has a display function.

According to the present embodiment, the display substrate can avoid the problem that the pixel electrode of the display device is cracked when it is climbed to the top surface of the drain, so the display device comprising the display substrate also can avoid the problem that the pixel electrode of the display device is cracked when it is climbed to the top surface of the drain.

The present embodiment of the disclosure further provides a manufacturing method for the display substrate, which comprises: forming a thin film transistor 2 and at least one pad structure 3 on a base substrate 1; herein, the pad structure 3 is located on an outer side of a drain 21 of the thin film transistor 2; the vertical distance between a top surface of the pad structure 3 and the base substrate 1 is less than a vertical distance $H_d$ between a top surface of the drain 21 and the base substrate 1 and greater than a vertical distance $H_0$ between the base substrate 1 and a top surface of the substrate which is located on a side of the pad structure 3 away from the drain 21.

In the display substrate provided in the present embodiment of the disclosure, the thin film transistor is formed on the base substrate, and at least one pad structure is formed on an outer side of the drain, so that during the subsequent formation of the pixel electrode, the pixel electrode first climbs from the top surface of the substrate which has a minimum vertical distance from the base substrate, to the top surface of the pad structure which has a middle vertical distance from the base substrate, and then climbs to the top surface of the drain which has a maximum vertical distance from the base substrate. As a result, the pixel electrode gradually climbs to the top surface of the drain by undergoing at least two transitions, and the climbing height in each transition is relatively small, so as to avoid the problem that the pixel electrode of the prior art has a large climbing height in only one transition, and also avoid the problem that the pixel electrode is cracked when it is climbed to the top surface of the drain.

Figure 5:
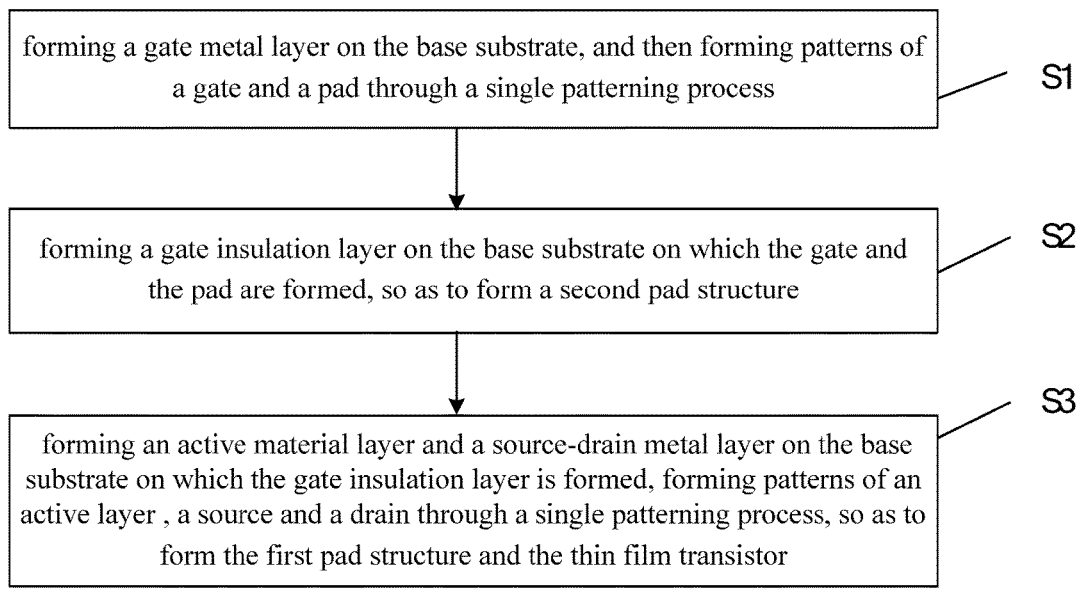
FIG. 5 schematically illustrates a flow diagram of manufacturing method for a display substrate according to an embodiment of the disclosure.

In order to be easily understood by those skilled in the art, the manufacturing process of the display substrate will be described in detail, and it is taken a first pad structure 31 and a second pad structure 32 which are comprised in the display substrate as an example in the present embodiment of the disclosure. For example, the thin film transistor 2 and at least one pad structure 3 are formed on the base substrate 1, as illustrated in FIG. 5, the method comprises:

S1, forming a gate metal layer on the base substrate 1, and then forming patterns of a gate 25 and a pad 4 through a single patterning process.

For example, the pad 4 is located only in a region of the second pad structure 32, or the pad 4 comprises a first pad 41 and a second pad 42 which are connected to each other, herein the first pad 41 is located in a region of the first pad structure 31, and the second pad 42 is located in a region of the second pad structure 32.

It is noted that, the patterning process provided in the present embodiments of the disclosure comprises for example: coating a photoresist, covering the photoresist by using a mask, etching after exposing and developing, and finally stripping off the photoresist.

In the configuration formed by step S1, the thickness of the pad 4 is equal to or less than the thickness of the gate 25. When the thickness of the pad 4 is less than the thickness of the gate 25, it is necessary to expose the base substrate 1 with a gray-scale mask which comprises a completely-light-tight region, a partially-light-transmitted region, and a completely-light-transmitted region, herein, the completely-light-tight region of the gray-scale mask corresponds to a region of the gate 25, the partially-light-transmitted region of the gray-scale mask corresponds to a region of the pad 4, and the completely-light-transmitted region of the gray-scale mask corresponds to the remaining region. After exposing and developing, the photoresist in the completely-light-transmitted region is removed, the photoresist in partially-light-transmitted region is partially retained, and the photoresist in the completely-light-tight region is completely retained. A portion of gate metal layer with no photoresist covering on it is completely removed by etching, and then the partially retained photoresist is removed by an ashing process. Next, newly exposed portion of gate metal layer is etched. During the etching, the thickness of the newly exposed portion of gate metal layer can be controlled by controlling etching conditions, for example, an etching time, thus the patterns of the gate 25 and the pad 4 are formed, and the pad 4 has a smaller thickness than the gate 25.

S2, forming a gate insulation layer 22 on the base substrate 1 on which the gate 25 and the pad 4 are formed, so as to form a second pad structure 32.

For example, the second pad structure 32 comprises the pad 4 and the gate insulation layer 22 which are located in a region of the second pad structure 32.

S3, forming an active material layer and a source-drain metal layer on the base substrate 1 on which the gate insulation layer 22 is formed, forming patterns of an active layer 23, a source 24 and a drain 21 through a single patterning process, so as to form the first pad structure 31 and the thin film transistor 2.

In step S3, since different patterns are simultaneously formed on both the active material layer and the source-drain metal layer, it is necessary to use the gray-scale mask in this patterning process, which comprises a completely-light-tight region, a partially-light-transmitted region, and a completely-light-transmitted region. Herein, a completely-light-tight region of the gray-scale mask corresponds to regions of the source 4 and the drain 21, a partially-light-transmitted region of the gray-scale mask corresponds to a region of the active layer 23, and a completely-light-transmitted region of the gray-scale mask corresponds to the remaining regions. After exposing and developing, the photoresist in the completely-light-transmitted region is removed, the photoresist in the partially-light-transmitted region is partially retained, and the photoresist in the completely-light-tight region is fully retained. The source-drain metal layer and the active material layer with no photoresist covering on them are completely removed after once etching, and then the partially retained photoresist is removed by an ashing process. Next, newly exposed portion of the source-drain metal layer is etched, and finally the photoresist is stripped off, thus the patterns of the active layer 23, the source 24 and the drain 21 are formed.

During this process, the completely-light-tight region of the gray-scale mask is simultaneously corresponding to the drain 21 and a drain region of the active layer 23, so that the outer edge of the drain 21 is aligned with the edge of the active layer 23. But, during the etching process after exposing, the source-drain metal layer located on an outer side of the drain 21 is first etched, and then the active material layer located on an outer side of the drain 21 is etched. Because a part of the drain 21 is simultaneously etched while etching the active layer material layer, outer edge of drain 21 is shrunk and the edge of the active layer 23 exceeds the outer edge of the drain 21, so as to form the first pad structure 31.

For example, the first pad structure 31 comprises the first pad 41, the gate insulation layer 22 and the active layer 23, all of which are located in a region of the first pad structure 31, the second pad structure 32 comprises the second pad 42 and the gate insulation layer 22 which are located in a region of the second pad structure 32, such that the display substrate illustrated in FIG. 2 is formed.

For example, the first pad structure 31 comprises the gate insulation layer 22 and the active layer 23 which are located in a region of the first pad structure 31, the second pad structure 32 comprises the pad 4 and the gate insulation layer 22 which are located in a region of the second pad structure 32, such that the display substrate illustrated in FIG. 3 or FIG. 4 is formed. Further, for example, when the vertical distance between the top surface of the second pad structure 32 and the base substrate 1 is less than the vertical distance between the top surface of the first pad structure 31 and the base substrate 1, the display substrate illustrated in FIG. 3 is formed; when the vertical distance between the top surface of the second pad structure 32 and the base substrate 1 is greater than the vertical distance between the top surface of the first pad structure 31 and the base substrate 1, the display substrate illustrated in FIG. 4 is formed.

In the manufacturing method for the display substrate provided in the present embodiment of the disclosure, the thin film transistor is formed on the base substrate, and at least one pad structure is formed on an outer side of the drain, so that during the subsequent formation of the pixel electrode, the pixel electrode is first climbed from the top surface of the substrate which has a minimum vertical distance from the base substrate, to the top surface of the pad structure which has a middle vertical distance from the base substrate, and then climbs to the top surface of the drain which has a maximum vertical distance from the base substrate. As a result, the pixel electrode gradually climbs to the top surface of the drain by undergoing at least two transitions, and the climbing height in each transition is relatively small, so as to avoid the problem that the pixel electrode of the prior art has a large climbing height in only one transition, and also avoid the problem that the pixel electrode is cracked when it is climbed to the top surface of the drain.

What is described above is related to the illustrative embodiments of the disclosure only and not limitative to the scope of the disclosure; the scopes of the disclosure are defined by the accompanying claims.

The present application claims the priority of Chinese patent application No. 201510141487.X filed on Mar. 27, 2015, the disclosure of which is hereby incorporated by reference herein in its entirety.

The invention claimed is:

1. A display substrate, comprising: a base substrate and a thin film transistor formed on the base substrate; the thin film transistor comprises a gate insulation layer and a drain;
   wherein at least one pad structure is disposed on an outer side of the drain; a vertical distance between a top surface of the at least one pad structure and the base substrate is less than a vertical distance between a top surface of the drain and the base substrate and greater than a vertical distance between the base substrate and a top surface of the gate insulation layer which is located on a side of the at least one pad structure away from the drain.

2. The display substrate according to claim 1, wherein the at least one pad structure comprises a first pad structure and a second pad structure disposed sequentially in a direction away from the drain, a vertical distance between a top surface of the second pad structure and the base substrate is less than a vertical distance between a top surface of the first pad structure and the base substrate.

3. The display substrate according to claim 2, wherein the at least one pad structure comprises a pad.

4. The display substrate according to claim 3, wherein the pad comprises a first pad and a second pad which are connected to each other;
   the thin film transistor comprises the gate insulation layer, an active layer, and a source and the drain disposed in the same layer, which are sequentially formed on the base substrate;
   the first pad structure comprises the first pad, the gate insulation layer and the active layer which are disposed in a region of the first pad structure;
   the second pad structure comprises the second pad and the gate insulation layer which are disposed in a region of the second pad structure.

5. The display substrate according to claim 4, wherein the thin film transistor further comprises a gate disposed between the gate insulation layer and the base substrate;
   the pad is disposed in the same layer as the gate, and a material of the pad is the same as that of the gate.

6. The display substrate according to claim 5, wherein a thickness of the pad is equal to or less than a thickness of the gate.

7. The display substrate according to claim 5, wherein the at least one pad structure is disposed on the base substrate.

8. The display substrate according to claim 3, wherein the thin film transistor comprises the gate insulation layer, an active layer, and a source and the drain disposed in the same layer, which are sequentially formed on the base substrate;
   the first pad structure comprises the gate insulation layer and the active layer which are disposed in a region of the first pad structure;
   the second pad structure comprises the pad and the gate insulation layer which are disposed in a region of the second pad structure.

9. The display substrate according to claim 8, wherein the thin film transistor further comprises a gate disposed between the gate insulation layer and the base substrate;
   the pad is disposed in the same layer as the gate, and a material of the pad is the same as that of the gate.

10. A display device, comprising the display substrate according to claim 1.

11. The display device according to claim 10, wherein the at least one pad structure comprises a first pad structure and a second pad structure disposed sequentially in a direction away from the drain, a vertical distance between a top surface of the second pad structure and the base substrate is less than a vertical distance between a top surface of the first pad structure and the base substrate.

12. The display device according to claim 11, wherein the at least one pad structure comprises a pad.

13. The display device according to claim 12, wherein the pad comprises a first pad and a second pad which are connected to each other;
   the thin film transistor comprises the gate insulation layer, an active layer, and a source and the drain disposed in the same layer, which are sequentially formed on the base substrate;
   the first pad structure comprises the first pad, the gate insulation layer and the active layer which are disposed in a region of the first pad structure;
   the second pad structure comprises the second pad and the gate insulation layer which are disposed in a region of the second pad structure.

14. The display device according to claim 13, wherein the thin film transistor further comprises a gate disposed between the gate insulation layer and the base substrate;

the pad is disposed in the same layer as the gate, and a material of the pad is the same as that of the gate.

15. The display device according to claim 14, wherein a thickness of the pad is equal to or less than a thickness of the gate.

16. The display device according to claim 14, wherein the at least one pad structure is disposed on the base substrate.

17. The display device according to claim 12, wherein the thin film transistor comprises the gate insulation layer, an active layer, and a source and the drain disposed in the same layer, which are sequentially formed on the base substrate;

the first pad structure comprises the gate insulation layer and the active layer which are disposed in a region of the first pad structure;

the second pad structure comprises the pad and the gate insulation layer which are disposed in a region of the second pad structure.

18. The display device according to claim 17, wherein the thin film transistor further comprises a gate disposed between the gate insulation layer and the base substrate;

the pad is disposed in the same layer as the gate, and a material of the pad is the same as that of the gate.

19. A method for manufacturing a display substrate, comprising:

forming a thin film transistor and at least one pad structure on a base substrate, the thin film transistor comprising a gate insulation layer and a drain;

wherein the at least one pad structure is disposed on an outer side of the drain of the thin film transistor; a vertical distance between a top surface of the at least one pad structure and the base substrate is less than a vertical distance between a top surface of the drain and the base substrate and greater than a vertical distance between the base substrate and a top surface of the gate insulation layer which is located on a side of the at least one pad structure away from the drain.

20. The method for manufacturing the display substrate according to claim 19, wherein the step of forming the thin film transistor and at least one pad structure on the base substrate comprises:

forming a gate metal layer on the base substrate, and forming patterns of a gate and a pad through a single patterning process;

forming the gate insulation layer on the base substrate on which the gate and the pad are formed, so as to form a second pad structure;

forming an active material layer and a source-drain metal layer on the base substrate on which the gate insulation layer is formed, forming patterns of an active layer, a source and the drain through a single patterning process, so as to form a first pad structure and the thin film transistor.

* * * * *